United States Patent
Berens et al.

[11] Patent Number: 6,119,573
[45] Date of Patent: Sep. 19, 2000

[54] CARBON FIBER FLOCKING FOR THERMAL MANAGEMENT OF COMPACT MISSILE ELECTRONICS

[75] Inventors: Thomas J. Berens; David W. Campbell; Peter J. Drake, all of Tucson, Ariz.; Timothy R. Knowles, San Diego, Calif.; Timothy B. Mellor, Tucson, Ariz.

[73] Assignee: Raytheon Company, Lexington, Mass.

[21] Appl. No.: 08/789,111

[22] Filed: Jan. 27, 1997

(Under 37 CFR 1.47)

[51] Int. Cl.[7] .................. F41F 3/04; F42C 45/00
[52] U.S. Cl. ............. 89/1.816; 89/1.8; 102/293
[58] Field of Search ................. 89/1.816, 1.8, 89/1.819; 102/293; 244/3.12; 428/113

[56] References Cited

U.S. PATENT DOCUMENTS

| | | | |
|---|---|---|---|
| 4,922,381 | 5/1990 | Longerich et al. | 102/293 |
| 5,251,099 | 10/1993 | Goss et al. | 361/721 |
| 5,257,755 | 11/1993 | Moser et al. | 102/293 |
| 5,284,095 | 2/1994 | Sabah | 102/293 |
| 5,852,548 | 12/1998 | Koon et al. | 361/704 |
| 5,874,152 | 2/1999 | Middelman | 428/113 |

*Primary Examiner*—Theresa M. Wesson
*Attorney, Agent, or Firm*—David W. Collins; Andrew J. Rudd; Glenn H. Lenzen, Jr.

[57] ABSTRACT

Carbon fiber material and carbon fiber material that is saturated with hydrocarbon solid-liquid phase change material may be used as thermal management materials for providing a thermally conductive interface between a heat source and its housing. Such carbon fiber material may also be used for mechanical isolation of the heat source from its housing. Carbon fibers used in the carbon fiber material may be unidirectionally oriented to provide for low friction, thus optimizing critically controlled friction tolerances. Additionally the carbon fiber material saturated with hydrocarbon solid-liquid phase change material may be used to transfer heat into the an inherently nonconductive medium.

17 Claims, 2 Drawing Sheets

CARBON FIBER FLOCKING FOR THERMAL MANAGEMENT OF COMPACT MISSILE ELECTRONICS

BACKGROUND

The present invention relates generally to thermal management systems for use in missiles, and the like, and more particularly, to the use of carbon fiber material as a thermally conductive interface between a missile housing and an electronics package disposed therein, and between the missile housing and the missile launcher, and to the use of carbon fiber material saturated with hydrocarbon solid-liquid phase change material as a heat sink on the launcher.

The assignee of the present invention designs and manufactures missile systems, and the like. Such missile systems includes relatively compact electronic control, guidance and computer systems, and the like, that require heat to be dissipated therefrom. A typical electronics package used in such missile systems is disclosed in U.S. Pat. No. 5,251,099, issued Oct. 5, 1993, entitled "High Density Electronics Package Having Stacked Circuit Boards", assigned to the assignee of the present invention. This patent discloses a high-density electronics package that houses a plurality of circular circuit cards along with heat sinks and circuit interconnections in a single enclosure. The electronics package is housed within a missile and is used as a guidance system for the missile. The present invention was developed for use with missiles employing these types of electronics packages.

Various thermal management constraints are imposed by requirements to retrofit existing missile systems. Small volume retrofit constraints are dominated by thermal flux limits in the heat conduction path between the missile and its launch tube, for example, and total energy limits of the available thermal system. The small volume of the thermal system presently available in manportable, air defense missiles forces conduction, and associated interfaces, to play a major role in the thermal management of the missile system. This problem is exacerbated when missiles are tightly fitted into thermally insulating launch tubes with critically controlled missile to tube friction (fly-out) tolerances.

Long duty cycle "on" time system requirements for the missile create relatively large thermal energy loads. Such high energy levels require significant thermal capacity, or in other words, a large heat sink. In order to minimize the overall weight of man-portable weapon systems, a low mass heat sink is required.

Accordingly, it is an objective of the present invention to provide for a missile system that exhibits improved thermal management capabilities. It is a further objective of the present invention to provide for a missile system that exhibits improved thermal management capabilities by using carbon fiber flocking material in conjunction with hydrocarbon solid-liquid phase change material to improve heat dissipation from the missile system during launch.

SUMMARY OF THE INVENTION

To meet the above and other objectives, the present invention provides for two thermal management technologies that may be used to provide thermal management structures for use in small diameter, tube launched, missiles, for example. The first technology provides for the use of carbon fiber flocking material as a thermally conductive interface between an electronics package (such as those employing fragile three-dimensional multi-chip module (MCM) circuits, for example) and a missile housing, that also provides for mechanical isolation of the electronics package from the missile structure.

Carbon fiber flocking materials may also be employed as an interface between the missile and its launch tube. The carbon fiber material contains carbon fibers that may be unidirectionally oriented to provide for low friction, thus optimizing critically controlled missile tube fly-out friction tolerances, for example.

Flocked carbon fibers have a large surface area, and have a thermally conductive surface that looks and feels like black velvet. Processes for flocking surfaces are relatively inexpensive, and the flocking material may be applied in a continuous process, not unlike methods used in the textile industry.

The second thermal management technology provides thermal capacity for the missile by utilizing hydrocarbon solid-liquid phase change material (PCM) as a saturant within carbon fiber containment structures disposed on the launcher. The hydrocarbon solid-liquid phase change material in combination with the carbon fiber material forms a unique composite system that resolves typical problems associated with waxy phase change materials, including microscopically uniform phase distribution as well as heat transfer into an inherently nonconductive medium (the missile launcher).

Thus, and in accordance with the present invention, carbon fiber material and carbon fiber material saturated with hydrocarbon solid-liquid phase change material may be used as thermal management structures as a thermally conductive interface between a heat source and its housing. The carbon fiber material may be used for mechanical isolation of the heat source from its housing. Carbon fibers used in the carbon fiber material may be unidirectionally oriented to provide for low friction, thus optimizing critically controlled friction tolerances. Additionally the carbon fiber material saturated with hydrocarbon solid-liquid phase change material may be used to transfer heat into the an inherently nonconductive medium.

Thermal characterization test specimens constructed using the flocked carbon fiber materials and phase change materials, in the small diameter form factor of a typical missile in which they may be employed were produced, instrumented, and tested to prove out the concepts of the present invention.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
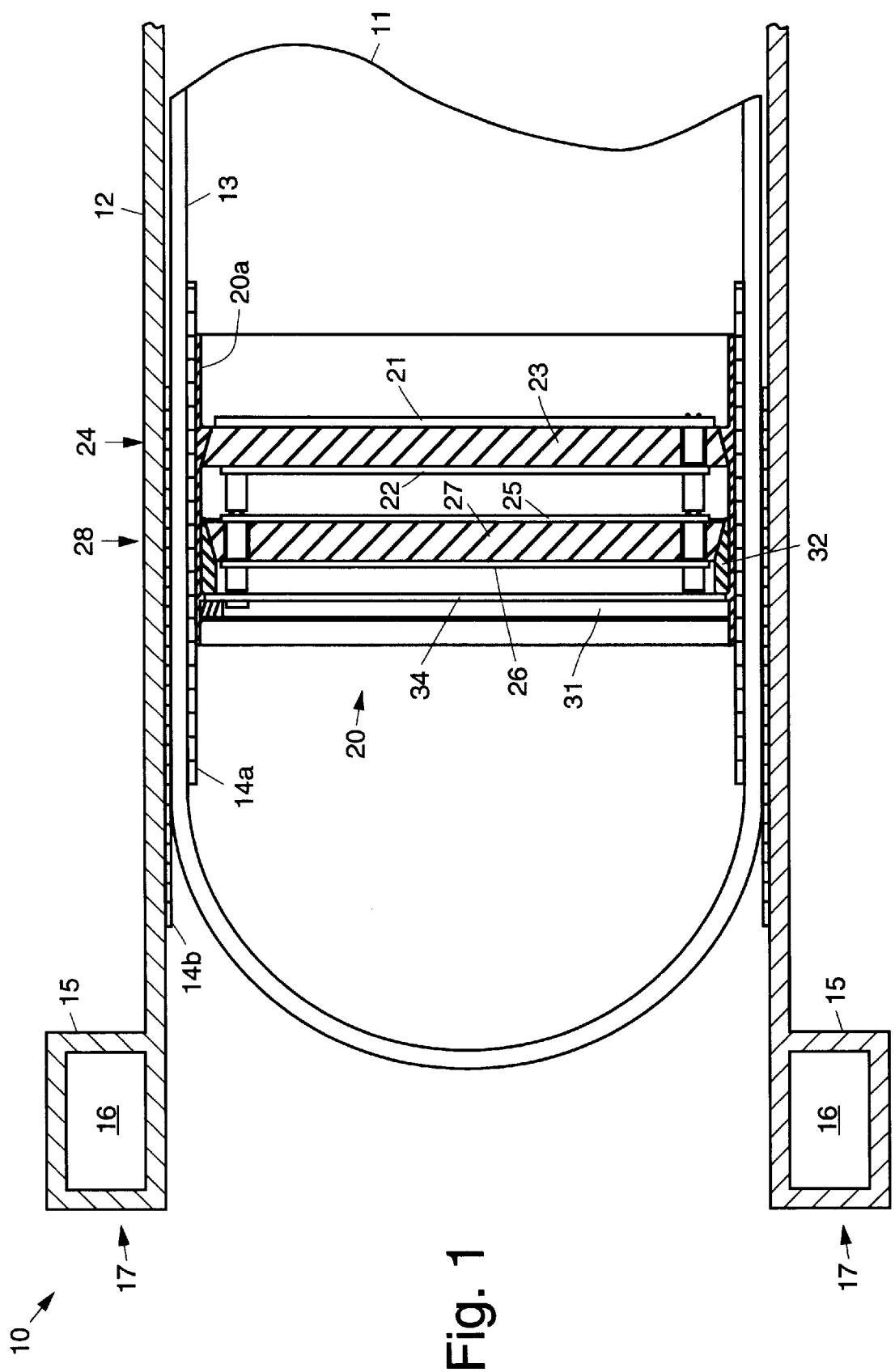
FIG. 1 illustrates a missile system employing thermal management concepts in accordance with the principles of the present invention.

Referring to the drawing figures, FIG. 1 illustrates a portion of a missile system 10 employing thermal management concepts in accordance with the principles of the present invention. The missile system 10 includes a missile launcher 12 (or first member 12) and a missile 11 (or second member 11) that is launched (or slid or ejected) from the missile launcher 12. The missile 11 has an electronics package 20 (that is a heat source 20) disposed within its body 13 or missile housing 13. The electronics package 20 may be a guidance electronics unit (GEU) 20 that was developed by the assignee of the present invention for use in retrofitting small diameter missiles 11 to enhance the acquisition range and guidance capabilities thereof. The design of the electronics package 20 is not critical to understanding the present invention, but will be described in some detail so that FIG. 1 may be better understood.

The electronics package 20 is comprised of a housing 20a into which a plurality of stacked circuit cards 21, 22, 25, 26 are disposed, and which are retained in the housing 20a by means of a conical surface on an internal wall of the housing 20a, and a lock ring 31 and wedge-ring 32. First and second circular circuit cards 21, 22 are bonded to a first heat sink 23 to form a first subassembly 24. A conical angle is formed on the edge of the first subassembly 24 that mates with the conical surface on the housing 20a. Third and fourth circuit cards 25, 26 are bonded to a second heat sink 27 and form a second subassembly 28. The wedge ring 32 has an internal angle that wedges itself between the outer edge of the second subassembly 28 and the internal wall of the housing 20a. An electrical interface board 34 is provided that is electrically connected to each of the circuit cards 21, 22, 25, 26. External connections are made by way of flat electrical cables or wires (not shown). The lock ring 31 and wedge-ring 32 secure the components in the housing 20a. Details of the construction of the electronics package 20 may be obtained from a reading of U.S. Pat. No. 5,251,099 cited in the Background section.

With regard to the present invention, in a first aspect, it provides for the use of carbon fiber flocking material 14 as a thermally conductive interface between the electronics package 20 and the missile housing 13. In particular, a first layer of flocking material 14a is disposed between an outer surface of the electronics package 20 and an inner wall of the missile housing 13 of the missile 11. In addition, the first layer of carbon fiber flocking material 14a provides mechanical isolation of the electronics package 20 from the missile housing 13.

Additionally, a second layer of carbon fiber flocking material 14b is disposed between an outer wall of the missile housing 13 and an inner wall of the launcher 12. Carbon fibers comprising the second layer of carbon fiber flocking material 14b may be unidirectionally oriented to provide for low friction, thus optimizing critically controlled missile launch tube fly-out friction tolerances. The second layer of carbon fiber flocking material 14b allows the missile 11 to slide out of the launcher 11 in a controlled manner.

The first and second layers of carbon fiber flocking material 14a, 14b may be comprised of carbon fiber flocking material developed by Energy Science Laboratories, Inc., for example. Flocked carbon fibers have a large surface area, and have a thermally conductive surface that looks and feels like black velvet. Processes for flocking surfaces are relatively inexpensive, and the layers of flocking material 14a, 14b may be applied in a continuous process, not unlike methods used in the textile industry.

In a second aspect of the present invention, a lightweight heat sink 17 is formed as a part of the launcher 12. The heat sink 17 comprises a cavity 15 formed adjacent one end of the launcher 12 that is filled with carbon fiber material 16 that is saturated with hydrocarbon solid-liquid phase change material. Typical hydrocarbon solid-liquid phase change materials include 2-carbon normal alkane dotriacontane, for example. Such hydrocarbon solid-liquid phase change materials are available from Energy Science Laboratories, Inc., and are well-suited for use in missile applications, and the like. The hydrocarbon solid-liquid phase change material forms a unique composite system that resolves typical problems associated with conventional waxy phase change materials, including microscopically uniform phase distribution as well as heat transfer into an inherently nonconductive medium (the missile launcher 12).

Figure 2:
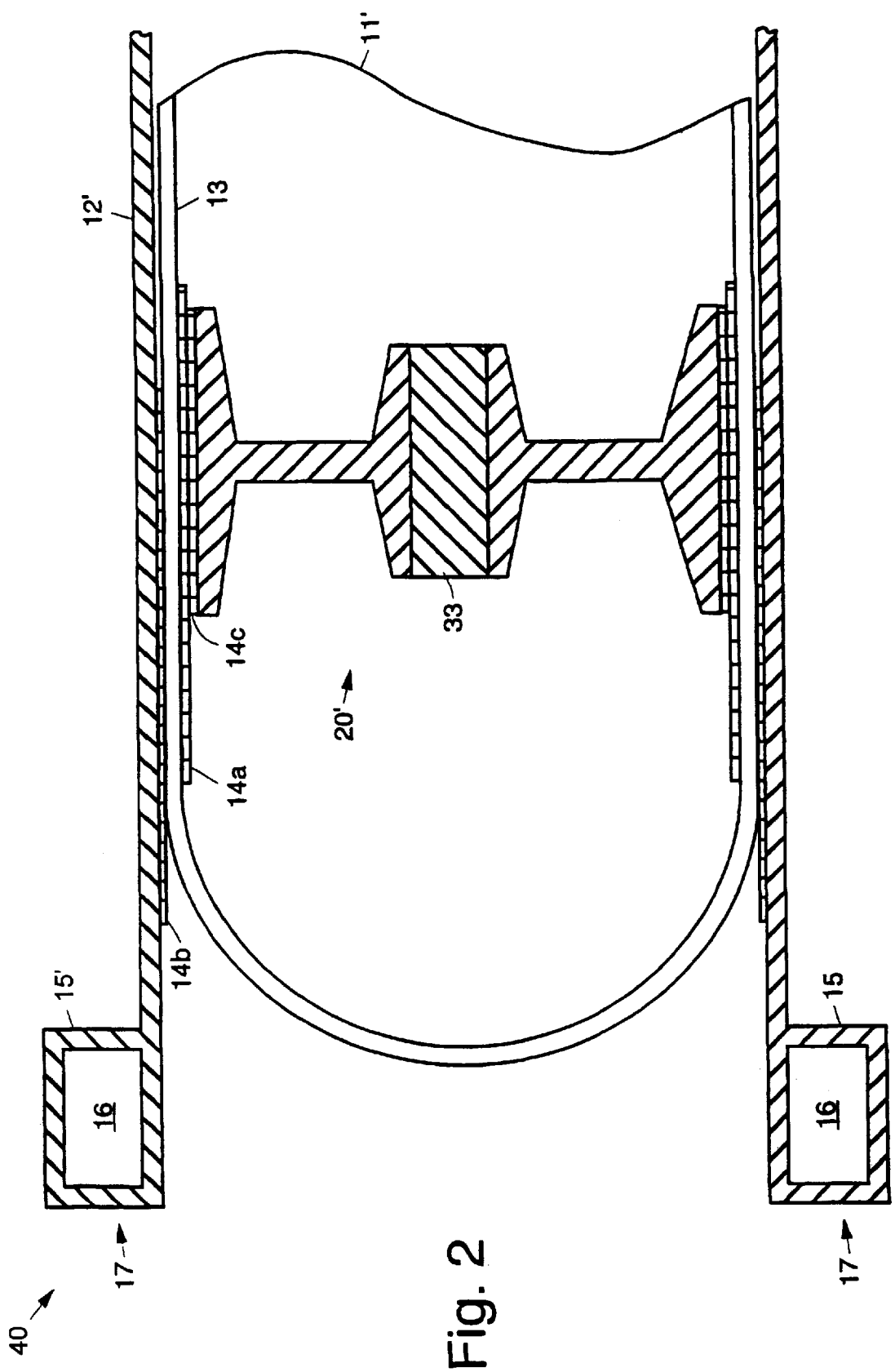
FIG. 2 illustrates a simulated electronics package, missile and launcher employed to test out the principles of the present invention.

Test apparatus 40 was fabricated to match the sizing and thermal requirements in a typical missile 11. FIG. 2 illustrates the test apparatus 40 which comprises a simulated electronics package 20', missile 11' and launch tube 12' employed to test out the principles of the present invention. The simulated launch tube 12' was machined from 6061 aluminum. Aluminum was used in place of copper and its thickness was increased by 391/167=2.341 so that it exhibited the same thermal conduction as a typical copper launcher 12 having its nominal thickness. A recess of 9.0"×0.015" was cut on the inside of the simulated launch tube 12' into which a 0.040" thick gasket comprising the second carbon fiber flocking material 14b was bonded using No. 2216 epoxy manufactured by Minnesota Mining and Manufacturing.

The outer housing 13 of the simulated missile 11' was also machined from 6061 aluminum and had a mass of 112 g. A 0.030" thick gasket comprising the first carbon fiber flocking material 14a was installed on the inside of the outer housing 13 that is used as an interface to the simulated, which was also bonded using No. 2916 epoxy manufactured by Minnesota Mining and Manufacturing.

The shape of the simulated electronics package 20' was chosen in an effort to match the 95 J/K heat capacity of an actual electronics package 20. The mass of the simulated electronics package 20' was 96.9 g and had a heat capacity of 86.8 J/K. A heater 33 was disposed at the center of the simulated electronics package 20' and had a mass of 15.6 g, but its composition was uncertain (the heater 33 was made of stainless steel, ceramic, and other materials). Assuming the heater 33 had about ⅔ the heat capacity of aluminum yields a heat capacity of about 9 J/K, so that the total heat capacity roughly matches the actual value of an actual electronics package 20.

The exterior surface of the simulated electronics package 20' was covered with a 0.020" thick first layer of carbon fiber flocking material 14a. The area of this layer 14a is 67.18 cm$^2$, matching another layer 14c of carbon fiber flocking material 14a disposed on the inner surface of the housing 13 of the simulated missile 11'. A nominal gap between the two adjacent layers of carbon fiber flocking material 14a, 14c was 0.032" so that interpenetration of the two material layers 14a, 14c by at least 0.012" occurred. Additional interpenetration of the velvet material is actually achieved because of the effective thickness of the bond line between two material layers 14a, 14c and their respective substrates (the outer surface of the simulated electronics package 20' and the inner surface of the simulated missile 11').

The lightweight heat sink 17 was formed as a cavity 15' that had a cavity volume of 45.81 cm$^3$. The cavity 15' was filled with carbon fiber material 16 having a density of 0.100 g/cm$^3$, which is available from Energy Science Laboratories, Inc., for example, which corresponds to approximately 5% fiber packing fraction. The cavity 15' was additionally filled with hydrocarbon solid-liquid phase change material. The carbon fiber material 16 is effective at increasing the thermal conductivity of the hydrocarbon solid-liquid phase change material to approximately 1 W m$^{-1}$ K$^{-1}$ and it serves as a wick to control the location of molten phase-change material. The phase-change material that was used was a 32-carbon normal alkane dotriacontane ($C_{32}H_{66}$), 99% pure. The melting range of the phase-change material was 68–70° C., and it had a latent heat of about 257 kJ/kg. The phase-change material had a total mass of 30.0 g and was loaded into the cavity 15 to provide a total of 7.70 kJ latent heat capacity. The heat capacity of the metal parts of the test article was approximately 0.40 kJ/K.

Long duty cycle "on" time system requirements of the electronics unit 20 create a thermal energy load for the electronics unit 20 of about 90 kJ. This energy level requires significant thermal capacity for the launcher 11, or in other words, a large heat sink 17. In order to minimize the overall weight of man-portable weapon systems, a low mass heat sink 17 is required. The solid-liquid phase change material offers heat of fusion thermal capacity without a severe weight penalty. Currently available hydrocarbon (wax) phase change materials are chemically stable, and can be easily formulated to match system melting point temperature requirements. Efficient transfer of heat directly into the low conductivity phase change material is achieved by using the flocked carbon fiber material 16. Strong capillary forces hold the phase change material in the carbon fabric of the carbon fiber material 16. The heat distribution within the phase change material is extremely uniform, thus preventing large mechanical stresses that develop when non-uniform solidification occurs in bulk, such as would occur in traditional containers made using phase change materials.

Test results derived from using the test apparatus 40 proved out the principles of the present invention. The test results showed that the carbon fiber materials 14 and saturated carbon fiber material 16 may be used as thermal management materials for providing a thermally conductive interface between an electronics package 20 and a missile housing 13, mechanical isolation of the electronics package 20 from the missile 11, and the carbon fibers may be unidirectionally oriented to provide for low friction, thus optimizing critically controlled missile tube fly-out friction tolerances, for example. Additionally it was determined that carbon fiber material 16 saturated with hydrocarbon solid-liquid phase change material may be used to transfer heat from a missile 11 to a missile launcher 12.

Thus, thermal management structures employing carbon fiber materials for use in missile systems, and the like, has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. Apparatus comprising:
   a first member;
   a second member that is slidable within the first member;
   a heat source disposed within the second member; and
   a first layer of carbon fiber flocking material that comprises a thermally conductive interface disposed between the heat source and an inner wall of the second member.

2. The apparatus of claim 1 wherein the first layer of carbon fiber flocking material provides mechanical isolation of the heat source and the second member.

3. The apparatus of claim 1 further comprising a second layer of carbon fiber flocking material disposed between an outer wall of the second member and an inner wall of the first member.

4. The apparatus of claim 3 wherein the carbon fibers comprising the second layer of carbon fiber flocking material are unidirectionally oriented to provide for low friction.

5. The apparatus of claim 1 further comprising
   a heat sink that comprises a cavity disposed on the first member that is filled with carbon fiber material that is saturated with hydrocarbon solid-liquid phase change material.

6. The apparatus of claim 5 wherein the hydrocarbon solid-liquid phase change material comprises 32-carbon normal alkane dotriacontane.

7. A missile system comprising:
   a missile launcher;
   a missile having a missile housing;
   an electronics package comprising a heat source disposed within the missile housing; and
   a first layer of carbon fiber flocking material that comprises a thermally conductive interface disposed between the electronics package and the missile housing.

8. The missile system of claim 7 wherein the first layer of carbon fiber flocking material provides mechanical isolation of the electronics package from the missile housing.

9. The missile system of claim 7 further comprising a second layer of carbon fiber flocking material disposed between an outer wall of the missile housing and an inner wall of the launcher.

10. The missile system of claim 9 wherein the carbon fibers comprising the second layer of carbon fiber flocking material are unidirectionally oriented to provide for low friction to optimize fly-out friction tolerances of the missile launcher.

11. The missile system of claim 7 further comprising
    a heat sink that comprises a cavity formed adjacent an end of the launcher that is filled with carbon fiber material that is saturated with hydrocarbon solid-liquid phase change material.

12. The missile system of claim 11 wherein the hydrocarbon solid-liquid phase change material comprises 32-carbon normal alkane dotriacontane.

13. A missile system comprising:
    a missile launcher;
    a missile having a missile housing;
    an electronics package comprising a heat source disposed within the missile housing;
    a first layer of carbon fiber flocking material that comprises a thermally conductive interface disposed between the electronics package and the missile housing; and
    a second layer of carbon fiber flocking material disposed between an outer wall of the missile housing and an inner wall of the launcher.

14. The missile system of claim 13 wherein the first layer of carbon fiber flocking material provides mechanical isolation of the electronics package from the missile housing.

15. The missile system of claim 13 wherein the carbon fibers comprising the second layer of carbon fiber flocking material are unidirectionally oriented to provide for low friction to optimize fly-out friction tolerances of the missile launcher.

16. The missile system of claim 13 further comprising
    a heat sink that comprises a cavity formed adjacent an end of the launcher that is filled with carbon fiber material that is saturated with hydrocarbon solid-liquid phase change material.

17. The missile system of claim 16 wherein the hydrocarbon solid-liquid phase change material comprises 32-carbon normal alkane dotriacontane.

* * * * *